US007003732B1

(12) United States Patent
Zhaksilikov

(10) Patent No.: US 7,003,732 B1
(45) Date of Patent: Feb. 21, 2006

(54) METHOD AND SYSTEM FOR DATA-DRIVEN DISPLAY GRIDS

(75) Inventor: Marat Zhaksilikov, Snohomish, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 557 days.

(21) Appl. No.: 09/999,609

(22) Filed: Oct. 31, 2001

(51) Int. Cl.
G09G 5/00 (2006.01)

(52) U.S. Cl. .................. 715/771; 715/503; 715/843; 716/5; 716/17

(58) Field of Classification Search ............. 345/771; 715/503, 509, 771, 843, 504, 901, 902, 903; 700/95, 96, 98; 716/1–21
See application file for complete search history.

(56) References Cited

U.S. PATENT DOCUMENTS

| 5,893,123 | A * | 4/1999 | Tuinenga ............... 715/504 |
| 6,167,364 | A * | 12/2000 | Stellenberg et al. ....... 703/19 |
| 6,718,515 | B1 * | 4/2004 | Conner et al. ........... 715/509 |
| 2002/0059195 | A1 * | 5/2002 | Cras et al. .............. 707/3 |
| 2002/0091728 | A1 * | 7/2002 | Kjaer et al. ............. 707/503 |
| 2002/0169799 | A1 * | 11/2002 | Voshell ................. 707/503 |
| 2003/0182220 | A1 * | 9/2003 | Galant ................. 705/36 |

* cited by examiner

Primary Examiner—Ba Huynh
(74) Attorney, Agent, or Firm—Wagner, Murabito & Hao LLP

(57) ABSTRACT

A method and system of automatically generating information in a grid structure on a display screen. In one embodiment, the present invention is directed to displaying and editing microcontroller chip configuration information. The method involves reading a data file describing a configurable sub-system of the microcontroller, identifying the configurable parameters of the sub-system and constructing a two dimensional display for displaying the values of variables associated with those parameters. The two dimensional display ("display grid") may contain a row for each parameter, a column for the name of the parameter, and a cell in each row for each variable associated with that parameter. The cells associated with variables can be restricted to accept values chosen from a set enumerated in the data file describing the configurable sub-system. The data file contains all information necessary for generating the grid display, including its width, length, data label information, cell data and data values that can be assigned to cells. A grid generator reads the data file and automatically generates the display grid based on the embedded data definitions.

27 Claims, 8 Drawing Sheets

```
<RESERVED_RESOURCE_LIST>
  <PIN_RESOURCE PORT = "0" BIT = "0" TYPE = "PIN" VALUE = "StdCPU">
    <PIN_RESOURCE_VALUE_LIST>
      <PIN_RESOURCE_VALUE PIN_VALUE = "StdCPU" DRIVE_TYPE = "Pull Down"/>
      <PIN_RESOURCE_VALUE PIN_VALUE = "Analog Input" DRIVE_TYPE = "High Z"/>
      <PIN_RESOURCE_VALUE PIN_VALUE = "Global_IN" DRIVE_TYPE = "Pull Down"/>
      <PIN_RESOURCE_VALUE PIN_VALUE = "Global_OUT" DRIVE_TYPE = "Pull Down"/>
      <PIN_RESOURCE_VALUE PIN_VALUE = "Global_OUT" DRIVE_TYPE = "Strong"/>
      <PIN_RESOURCE_VALUE PIN_VALUE = "Global_OUT" DRIVE_TYPE = "Pull Up"/>
    </PIN_RESOURCE_VALUE_LIST>
  </PIN_RESOURCE>
```

FIGURE 3

METHOD AND SYSTEM FOR DATA-DRIVEN DISPLAY GRIDS

BACKGROUND OF THE INVENTION

1. Field of the Invention

Embodiments of the present invention relate to the field of graphical user interfaces. Embodiments are directed to the display of information, e.g., configuration information, for a programmable chip. More particularly, embodiments of the present invention relate to a data-driven display of microcontroller configuration values.

2. Related Art

Generally, a microcontroller is an integrated circuit device ("chip") composed of functional blocks, input/output pins, internal busses and programmable interconnections among these and similar components. Each of these items can be treated as a sub-system that can be configured (or programmed) to perform a specific function by loading a particular bit pattern into a particular register in an actual chip.

Configuring a modern microcontroller can require specifying and setting an enormous number of bits. It is common for engineers who need to configure a microcontroller to develop and use software for that purpose. A design system is a computer program that has a data structure in memory that models the various sub-systems, the allowable configurations for each sub-system and a current configuration for each sub-system. The design system permits a user to manipulate the configurations symbolically and generate the executable code that would configure an actual microcontroller. In conjunction with an in-circuit emulator, the design system could control and debug an actual microcontroller.

A design system can be developed with a software development system and makes use of graphical user interface (GUI) components in the form of objects taken from a class library, such as Microsoft's Foundation Class Library used with its Visual C Development System. One useful object is a grid, which is an array of user-editable cells that can contain and display text. Dundas Software provides a library of objects, including a two-dimensional grid.

One limitation of existing design systems is that the dimensions of the display grid are defined by the software program that generates the grid. Therefore, separate executable routines are required for grid displays of different dimensions. Each display grid is therefore displayed using a "custom" display routine. In other words, the design system's GUI and data structures, such as the dimensions and contents of a grid, are intimately tied to the architecture and characteristics of a particular microcontroller at the time the design system is compiled and linked. If a grid dimension needs to change, e.g., to accommodate a different microcontroller design, etc., then the programming software needs to be redesigned for the new microcontroller. Redesigning software for new chip designs is a very expensive and time consuming process. Thus, if there are changes to a microcontroller or a new microcontroller is created, the design system also needs to be updated and redistributed.

SUMMARY OF THE INVENTION

Accordingly, what is needed is a design system that can be loaded with data about a microcontroller after the design system is deployed in the field. In particular, to facilitate such a new design system, the characteristics and contents of the two dimensional grids would need to determined from the data provided to the design system in the field. A data-driven display grid would aid in solving this problem. The present invention provides these advantages and others not specifically mentioned above but described in sections to follow.

An embodiment of the present invention is directed to a method and system of automatically generating information in a grid structure on a display screen. In one embodiment, the present invention is directed to displaying and editing microcontroller chip configuration information. The method involves reading a data file describing a configurable subsystem of the microcontroller, identifying the configurable parameters of the sub-system and constructing a two dimensional display for displaying the values of variables associated with those parameters. The two dimensional display ("display grid") may contain a row for each parameter, a column for the name of the parameter, and a cell in each row for each variable associated with that parameter. The cells associated with variables can be restricted to accept values chosen from a set enumerated in the data file describing the configurable sub-system. The data file contains all information necessary for generating the grid display, including its width, length, data label information, cell data and data values that can be assigned to cells. A grid generator reads the data file and automatically generates the display grid based on the embedded data definitions.

More specifically, an embodiment is directed to a method (and computer system) for displaying configuration information within a design system for an integrated circuit device, e.g., a microcontroller, the method comprising: accessing a computer file comprising a description of a sub-system of the microcontroller, the sub-system comprising a plurality of parameters; and automatically rendering and displaying the plurality of parameters in a two-dimensional display grid comprising a number of rows and a number of columns that are determined by parameters stored in the computer file. Embodiments include the above and wherein the computer file further comprises: a first parameter comprising a first variable being restricted to a set of values; and a default value of the set of values; and wherein the automatically displaying comprises displaying the default value in a cell corresponding to the variable within the two-dimensional display grid.

Embodiments include the above and wherein the automatically displaying comprises displaying a drop down menu near the cell, the drop down menu comprising a display of the set of values. Embodiments also include the above and wherein the computer file contains a data vector comprising the parameters and wherein the parameters are XML formatted data.

BRIEF DESCRIPTION OF THE DRAWINGS

FIG. 3 is a portion of a part description file that is input to the automatic grid generation processes of the present invention.

DETAILED DESCRIPTION OF THE INVENTION

In the following detailed description of the present invention, a computer implemented data-driven display grid, numerous specific details are set forth in order to provide a thorough understanding of the present invention. However, it will be obvious to one skilled in the art that the present invention may be practiced without these specific details. In other instances well known methods, procedures, components, and circuits have not been described in detail as not to unnecessarily obscure aspects of the present invention.

Notation and Nomenclature

Some portions of the detailed descriptions that follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those utilizing physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "checking," "comparing," "accessing," "processing," "computing," "suspending," "resuming," "translating," "calculating," "determining," "scrolling," "displaying," "recognizing," "executing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Computer System 112

Figure 1:
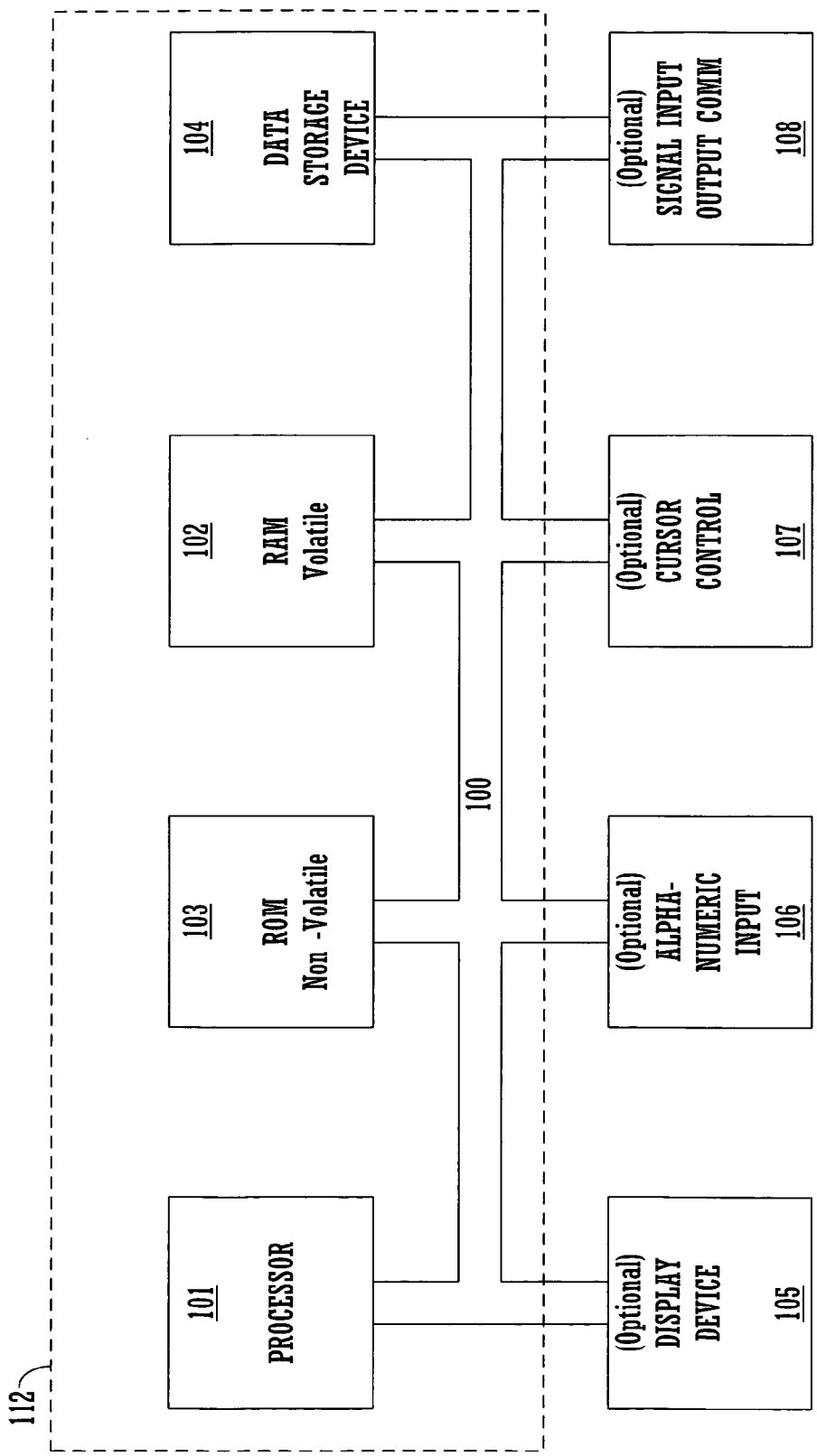
FIG. 1 is a general purpose computer system on which embodiments of the present invention may be implemented.

Aspects of the present invention, a data-driven display grid that may be used in configuring a microcontroller, are discussed in terms of steps executed on a computer system. Although a variety of different computer systems can be used with the present invention, an exemplary computer system 112 is shown in FIG. 1. It is further appreciated that while the data driven display grid is described herein as pertaining to microcontroller parameterization information, the scope of the present invention pertains to the display of any information in a grid format. This in mind, the use of microcontroller parameterization information is merely exemplary.

Exemplary computer system 112 comprises an address/data bus 100 for communicating information, a central processor 101 coupled with the bus for processing information and instructions, a volatile memory 102 (e.g., random access memory) coupled with the bus 100 for storing information and instructions for the central processor 101 and a non-volatile memory 103 (e.g., read only memory) coupled with the bus 100 for storing static information and instructions for the processor 101. Computer system 112 also includes a data storage device 104 ("disk subsystem") such as a magnetic or optical disk and disk drive coupled with the bus 100 for storing information and instructions and a display device 105 coupled to the bus 100 for displaying information to the computer user.

Also included in computer system 112 is an alphanumeric input device 106 including alphanumeric and function keys coupled to the bus 100 for communicating information and command selections to the central processor 101. Generally, alphanumeric input device 106 is called a keyboard or keypad. System 112 also includes a cursor control or directing device 107 coupled to the bus for communicating user input information and command selections to the central processor 101. Within the context of the present invention, the cursor directing device 107 can include a number of implementations including a mouse device, for example, a trackball device, a joystick, a finger pad (track pad), an electronic stylus, an optical beam directing device with optical receiver pad, an optical tracking device able to track the movement of a user's finger, etc., or any other device having a primary purpose of moving a displayed cursor across a display screen based on user displacements.

Computer system 112 of FIG. 1 can also include an optional signal generating device 108 coupled to the bus 100 for interfacing with other networked computer systems, e.g., over the Internet. The display device 105 of FIG. 1 utilized with the computer system 112 of the present invention may be a liquid crystal device, other flat panel display, cathode ray tube, or other display device suitable for creating graphic images and alphanumeric characters recognizable to the user.

Data Driven Display Grid in Accordance with Embodiments of the Present Invention In a preferred embodiment, a data-driven display grid is used for the display of information in a grid structure. A grid generator reads a data file defining the display grid. In response to reading the data file, the grid generator then automatically generates the display grid according to the definitions of the data file. In one exemplary embodiment, the display grid can be used in conjunction with a design system for configuring and programming a microcontroller.

A microcontroller can be organized into sub-systems. Each of the sub-systems can have elements that can be configured (or parameterized) to perform specific functions by specifying the contents of data registers. A particular portion of a sub-system that can be configured is called a parameter. A sub-system can have more than one parameter. The bit registers associated with a parameter form a variable that can be set to a specific value to perform, initiate or control a particular function. The set of allowable values that can be assigned to a particular variable will be called the range set for that variable.

In some cases, a user would find it easier to manage the configuration process by having the registers associated with a parameter divided up into two or more variables, and have each variable take on a separate value. For example, it may be useful to have a sub-system composed of the microcontroller input/output pins. Each input/output pin would be a parameter. Each input/output pin would need to have its direction specified (input, output, bi-directional) which would correspond to one variable. For a given pin, it may be desirable to specify which internal bus should be connected to that pin. The bits specifying this connection would be another variable associated with the parameters associated with the sub-system.

A two-dimensional display grid may be constructed for a sub-system with a row for each parameter, a column for the name of the parameter and a column for each variable associated with a parameter. The value assigned to a variable will be displayed in the cell.

Figure 2:
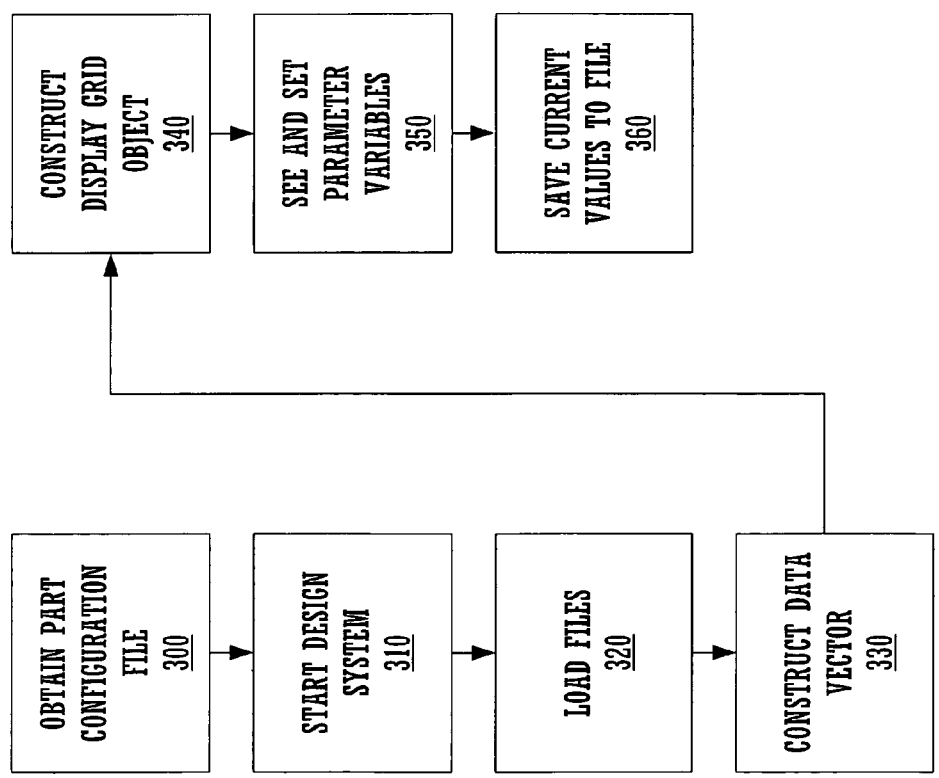
FIG. 2 is a flow diagram showing steps of a process, in accordance with the present invention, for automatically generating display grids.

FIG. 2 shows a high level process of making and using a data-driven display grid in accordance with embodiments of the present invention. In step 300, the user obtains one or more part description (configuration) files. The user places these files on a data storage device 104. Each part description file specifies the various sub-systems and parameters found in a particular type of microcontroller. A part description file also describes the range set for each variable of each parameter. A part description file also specifies an initial value for each variable.

A portion of an exemplary part description file is shown in FIG. 3 showing the range set associated with an input/output pin. In a preferred embodiment, the part description file is organized with XML tags.

In step 310 of FIG. 2, the user starts the design system computer program on a computer system 112.

In step 320, the design system constructs a data structure in volatile memory 102 from the sub-systems and parameters found in the part description file. The data structure also contains the range sets and the initial values found in the parts description file. If the user has already been working with a particular design, the user would have saved the result of that effort in a project configuration file. If so, the project configuration file would also be read in step 320. The variable values found in the project configuration file would supercede the initial values specified in the part description files.

Figure 8:
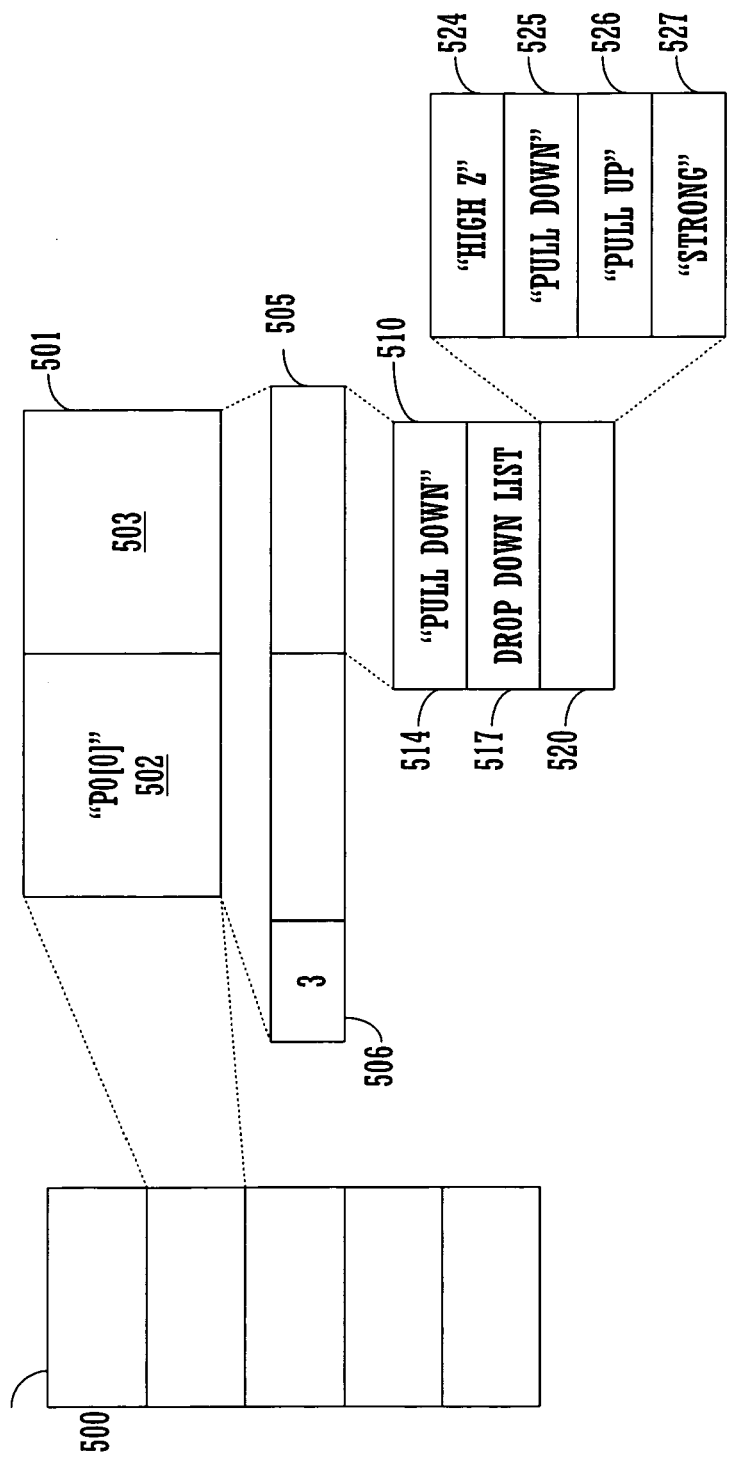
FIG. 8 is a exploded view of a portion of a data vector for a 3-column display grid.

In step 330, the design system constructs a data vector for each sub-system that will have its parameters displayed. A graphical representation of a portion of a data vector 500 is graphically represented in FIG. 8 for a preferred embodiment. In that embodiment, the data vector 500 is implemented as vector of pairs. There will be a pair 501 for each grid row. The first element of the pair 502 specifies the name of the parameter. The second member of the pair 503 is a collective data object 505, such as a vector, array, linked list, or associative array, that has a member 510 holding the information for each variable associated with the parameter. It could also contain the number of columns 506. Such information could include a current value 514 for that variable, a display type 517 for that variable, the range set 520 for that variable. The display type 517 will be used to specify how the user can manipulate the information associated with this variable. The range set could be implemented as a collective object with enumerated elements 524, 525, 526 and 527 for each allowed value for the variable.

In short, a data vector is derived from a data file containing all of the necessary information for producing a two dimensional display grid, including the size of the grid, the default contents of the cells, allowable values that the cells can be changed to and certain header and label information useful in understanding the display grid.

In step 340, the design system uses an automatic grid generator to automatically create a data-driven display object from the data vector in accordance with the process shown in FIG. 6, which will be described in greater detail later in this section. The display object is generated as a direct result of the definitions of the data vector. Therefore, the size of the display grid, (e.g., the number of columns, the numbers of rows), the default contents of the cells, the allowable values that the cells can be changed to, the header information, the data labels, etc., are all a function of the data vector. In a sense, the display grid object is generated "on-the-fly" by the automatic grid generator according to the display attribute definitions stored in the data vector.

Figure 4:
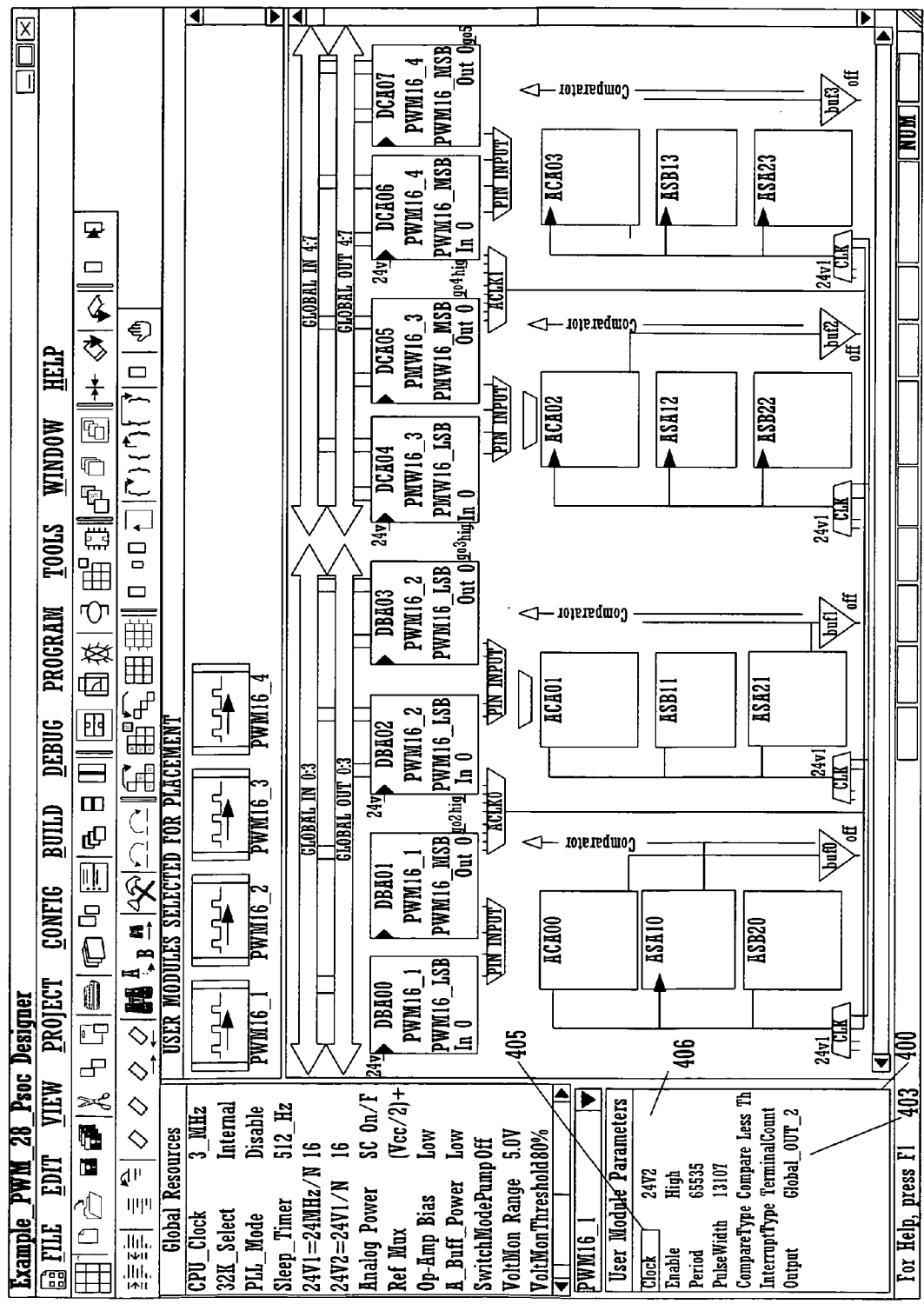
FIG. 4 shows a screen shot of the design system with a 2-column data display grid in accordance with an embodiment of the present invention.

In step 350, the user manipulates the graphical elements of the design system using alpha-numeric input devices 106 (such as a keyboard) or a cursor control device 107 (such as a mouse). The design system displays a data-driven display object 403 corresponding to a particular sub-system in the screen shot shown in FIG. 4. The two dimensional data-driven display object 403 of FIG. 4 has a rectangular array of cells. Cell 405 shows the name of a parameter and cell 406 shows the value set to the variable corresponding to that parameter. In this exemplary case, there are two columns and several rows of data. The default cell contents are also shown. The data vector for this grid contains the required information for generating every aspect of the display grid 403.

Figure 5:
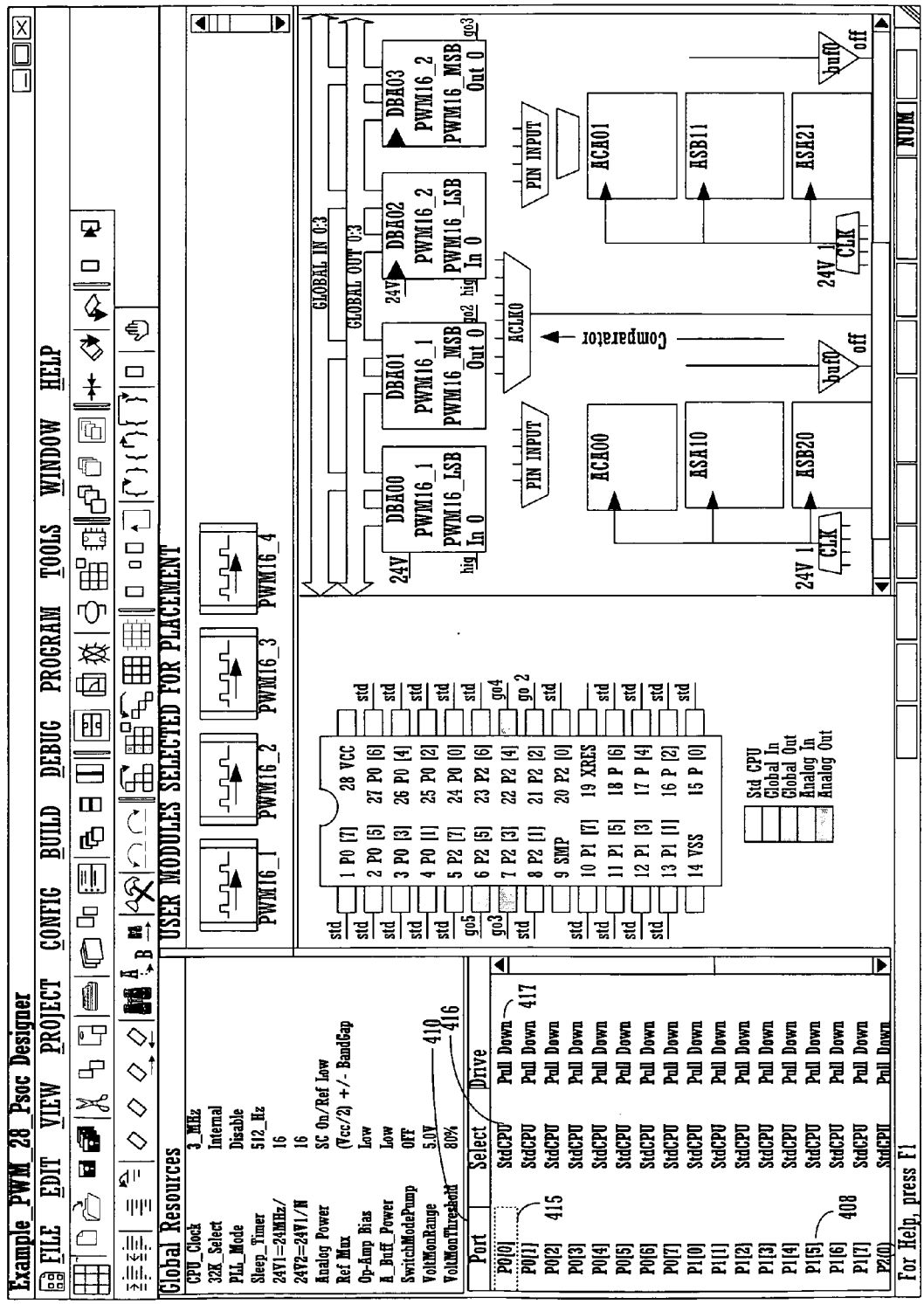
FIG. 5 shows a screen shot of the design system with a 3-column display grid in accordance with an embodiment of the present invention.

An instance of a data-driven display object 408 for a different sub-system is shown in FIG. 5. In this case, the grid display 408 contains three columns and several rows. Data-driven display object 408 has column headings 410, parameter name 415 and two variable cells 416 and 417. The data vector for this grid contains the required information for generating every aspect of the display grid 408.

Figure 6:
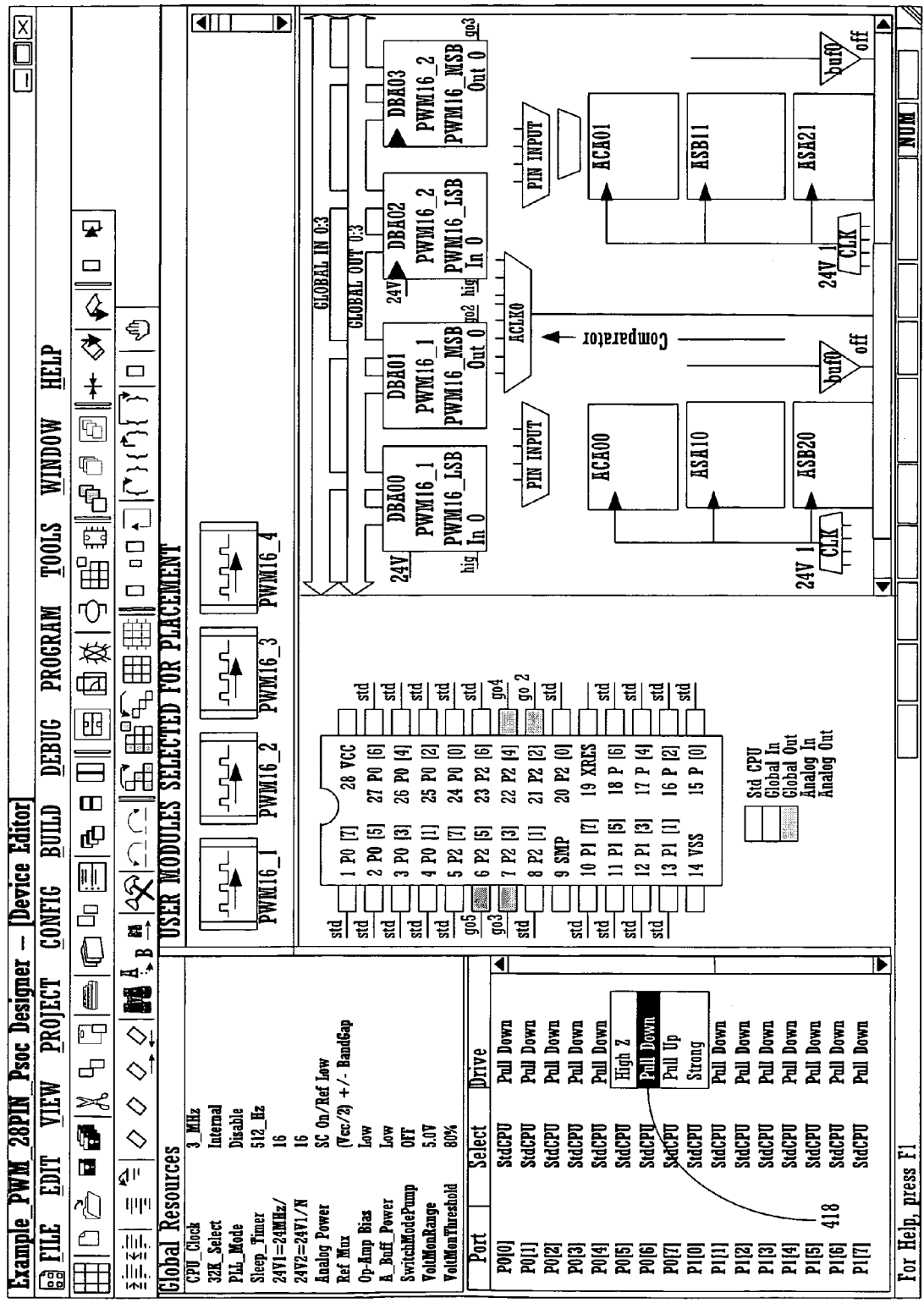
FIG. 6 shows a screen shot of the design system with a display grid exhibiting a drop down list in accordance with an embodiment of the present invention.

FIG. 6 shows cell 417 (FIG. 5) with a drop-down menu 418 (FIG. 6). The drop-down menus can be used for altering the default values of a cell in accordance with the present invention. The user selects a cell, e.g., using a mouse button, and this causes the drop down menu to appear. The user can then select a value from this list or "menu." The selected value then becomes the default value for the selected cell. It is appreciated that the range of allowable values that a cell can be changed to may also be defined, for each appropriate cell, in the data vector.

In step 350 of FIG. 2, the user may also manipulate the mouse and keyboard to set values in cells 406, 416, 417.

In step 360, the design system saves the values currently stored in the variables in a project configuration file. In a preferred embodiment, the project configuration file uses XML. When the user resumes working on the project, the user can reactivate the design system again at step 320, which will then load the variables with the saved values in the project configuration file.

Figure 7:
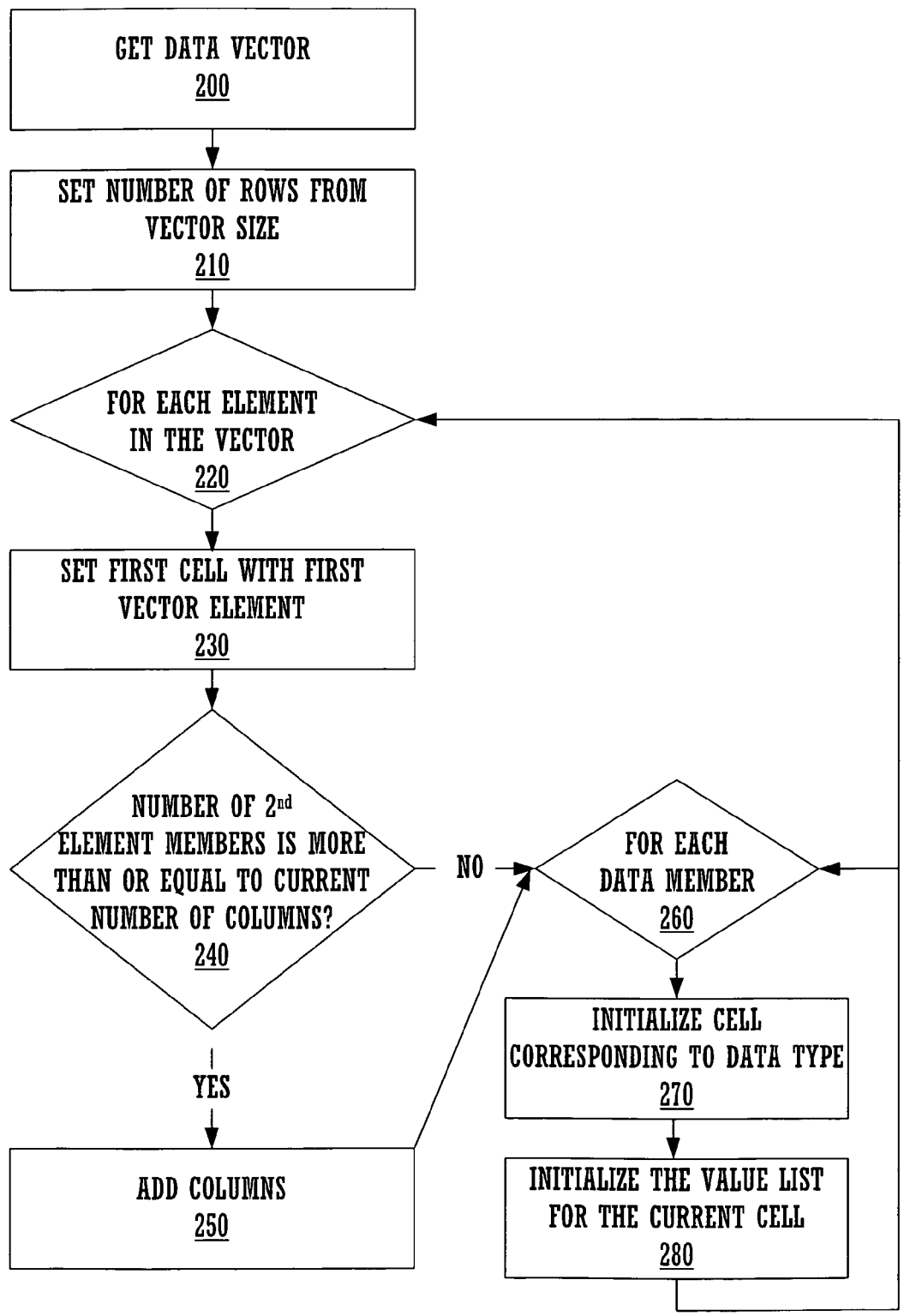
FIG. 7 is a flow diagram illustrating steps of initializing a data-driven display object in accordance with an embodiment of the present invention.

Step 340, the automatic display grid generator, is expanded into greater detail in FIG. 7. Step 200 of FIG. 7 obtains the data vector developed in step 330. Step 210 creates an instance of a data-driven display object that contains a two-dimensional grid object, such as can be obtained from Dundas Software. The design system sets the number of rows in the two-dimensional grid object to the number of pairs in the data vector. The number of pairs in the data vector will be a property if the data vector is implemented as a collective object, such as an array, chosen from the Microsoft Foundation Class Library. Alternatively, the design system could simply count the number of elements.

Step 220 initiates a loop for each pair in the data vector. The design system sets a current row indicator to the first row in the two-dimensional grid object.

In step 230 of FIG. 7, the design system sets the contents of the first cell in the current row to the first element of the currently selected pair. For the first row, it would typically be a column heading describing the type of parameter name, or simply, "name". For rows other than the first row or for a grid without column headings, the first cell would be set to the name of the parameter.

The second element of the currently selected pair vector is a collective object. In step 240, compare the number of members in the second element of the currently selected pair to the number of current columns. If there are more members than there are columns currently allocated in the two-dimensional grid object, proceed to step 250. In step 250, increase the number of columns in the two dimensional grid object to accommodate the extra number of members. Note that in an embodiment with column headings in the first element, steps 240 and 250 would not be required in subsequent passes because the number of columns would be set with the first element.

Step 260 begins iterating through the members of the $2^{nd}$ element of the currently selected pair. In step 270, the design system sets the initial value of the cell in the two-dimensional grid object as specified by the member. In step 280, the design system determines how the user can set the contents of the cell. If there is a range set, then the cell should be configured to have a drop down list. If the value can be an integer, then a spinner control or scrolling list could be used. Alternatively, the user could be permitted to simply enter text or a number.

Steps 270 and 280 are repeated for each member of the $2^{nd}$ element of the currently selected pair. After that, the currently selected pair is advanced to the next pair in the data vector and the process begins again with step 230.

In this fashion, embodiments of the present invention provide an automatic grid display generator that can read in a data file and, therefrom, automatically generate a grid display having various attributes as defined herein. One grid display process can therefore generate a variety of differently sized and complemented display grids to accommodate various integrated circuit designs and parts.

The preferred embodiment of the present invention, a data-driven display grid, is thus described. While the present invention has been described in particular embodiments, it should be appreciated that the present invention should not be construed as limited by such embodiments, but rather construed according to the below claims.

What is claimed is:

1. A method for displaying configuration information within a design system for configuring a microcontroller, said method comprising:
   responsive to a user selection of a sub-system of a plurality of sub-systems of a microcontroller, accessing a computer file comprising a description of said sub-system of said microcontroller, said sub-system comprising a plurality of parameters;
   automatically rendering and displaying said plurality of parameters in a two-dimensional display grid comprising a number of rows and a number of columns that are determined by parameters stored in said computer file;
   receiving user input of a value corresponding to at least one parameter of said plurality of parameters; and
   storing said value in said computer file, wherein said computer file is accessible by said design system for configuring a microcontroller.

2. The method of claim 1, wherein said computer file further comprises:
   a first parameter comprising a first variable being restricted to a set of values; and
   a default value of said set of values; and
   wherein said automatically displaying comprises displaying said default value in a cell corresponding to said variable within said two-dimensional display grid.

3. The method of claim 2 wherein said automatically displaying comprises displaying a drop down menu near said cell, said drop down menu comprising a display of said set of values.

4. The method of claim 1 wherein said computer file contains a data vector comprising said parameters and wherein said parameters are XML formatted data.

5. A computer system comprising a processor coupled to a bus and a memory coupled to said bus, said memory containing instructions to implement a method for displaying configuration information within a design system for configuring a microcontroller, said method comprising:
   responsive to a user selection of a sub-system of a plurality of sub-systems of a microcontroller, accessing a computer file comprising a description of said sub-system of said microcontroller, said sub-system comprising a plurality of parameters;
   automatically rendering and displaying said plurality of parameters in a two-dimensional display grid comprising a number of rows and a number of columns that are determined by parameters stored in said computer file;
   receiving user input of a value corresponding to at least one parameter of said plurality of parameters; and
   storing said value in said computer file, wherein said computer file is accessible by said design system for configuring a microcontroller.

6. The computer system of claim 5, wherein said computer file further comprises:
   a first parameter comprising a first variable being restricted to a set of values; and
   a default value of said set of values; and
   wherein said automatically displaying comprises displaying said default value in a cell corresponding to said variable within said two-dimensional display grid.

7. The computer system of claim 6 wherein said automatically displaying comprises displaying a drop down menu near said cell, said drop down menu comprising a display of said set of values.

8. The computer system of claim 5 wherein said computer file contains a data vector comprising said parameters and wherein said parameters are XML formatted data.

9. A method of displaying a two dimensional array of information on a computer system, said method comprising:
   responsive to a user selection of a sub-system of a plurality of sub-systems of a microcontroller within a microcontroller design system, accessing a computer file comprising data associated with said sub-system and defining a two dimensional array including a predefined number of rows and a predefined number of columns;
   automatically rendering and displaying a grid with said predefined number of rows and said predefined number of columns of cells;
   receiving user input of a value corresponding to at least one cell of said grid; and
   storing said value in said computer file, wherein said computer file is accessible by said microcontroller design system.

10. The method of claim 9 wherein said data specifies parameters for programming a programmable integrated circuit device.

11. The method of claim 10 wherein said data further specifies column headings as a first row of said grid.

12. The method of claim 10 wherein said data further specifies a plurality of variable names within said grid and default data for each of said variable names.

13. The method of claim 12 wherein said data further specifies a set of allowable values for each of said variable names.

14. A design system for configuring a microcontroller wherein said microcontroller has a plurality of parameters, said design system comprising:
   a computer file specifying a sub-system of a plurality of sub-systems of said microcontroller, said computer file accessible in response to a user selection of said sub-system of said plurality of sub-systems and comprising a plurality of parameters;
   a first computer program for automatically rendering and displaying a two dimensional grid comprising a number of rows as determined by a vector data structure stored in said computer file;
   a second computer program for receiving user input of a value corresponding to at least one cell of said grid; and
   a third computer program for storing said value in said computer file, wherein said computer file is accessible by said design system for configuring a microcontroller.

15. A design system as described in claim 14 wherein said two dimensional grid comprises a number of columns as determined by said vector data structure stored in said computer file.

16. A design system as described in claim 15 wherein said vector data structure comprises XML formatted data.

17. The design system as described in claim 15, wherein said vector data structure further comprises:
   a first parameter;
   a first value for said first parameter;
   a first range set comprising a collection of allowable values for said first value;
   wherein said computer file enumerates said first range set; and
   wherein said grid comprises a row corresponding to said first parameter with an editable cell within said row corresponding to said first value; and
   wherein said cell contents being restricted to said first range set.

18. The design system as described in claim 15, wherein said vector data structure further comprises:
   a first parameter;
   a first variable for said first parameter;
   a first initial value for said first variable;
   wherein said computer file specifying said first initial value; and
   wherein said grid comprises a row corresponding to said first parameter with an editable cell within said row corresponding to said first attribute; and
   wherein said cell contents being initially set to said first initial value.

19. The design system as described in claim 18, wherein said vector data structure further comprises:
   a first initial value for said first value;
   wherein said computer file specifying said first initial value; and
   wherein said editable cell initially being set to said first initial value.

20. The design system as described in claim 15, wherein said vector data structure further comprises:
   a first parameter comprising a first variable specified in said computer file and a second variable specified in said computer file;
   wherein said grid comprises a row corresponding to said first parameter with a first cell within said row corresponding to said first variable; and
   a second cell within said row corresponding to said second variable.

21. A data driven display object for display on a display screen of a computer system, said data driven display object comprising:
   a vector defining a two dimensional grid comprising a predefined number of rows and a predefined number of columns, wherein said vector is accessible in response to a user selection of a sub-system of a plurality of sub-systems of a microcontroller within a design system for configuring a microcontroller; and
   a first editable cell in a row and column wherein said first editable cell is set with an initial value corresponding to a parameter of said sub-system of said microcontroller, wherein a user-defined value corresponding to said editable cell is stored in a computer program accessible by said design system for configuring a microcontroller.

22. A data driven display object of claim 21, further comprising a second editable cell in said row with said second editable cell being set with an initial value corresponding to a second variable of said parameter of said sub-system of said microcontroller.

23. The data driven display object of claim 21 wherein said first editable cell is a spinner control.

24. The data driven display object of claim 21 wherein said vector comprises XML formatted data.

25. A data driven display object for display on a display screen of a computer system, said data driven display object comprising:
   a data vector defining a two dimensional display grid comprising a row, wherein said data vector is accessible in response to a user selection of a sub-system of a plurality of sub-systems of a microcontroller within a design system for configuring a microcontroller; and
   a first editable cell in said row wherein said first editable cell is restricted to a range set for a variable corresponding to a parameter of said sub-system of said microcontroller, wherein a user-defined value corresponding to said editable cell is stored in a computer program accessible by said design system for configuring a microcontroller.

26. The display object of claim 25, further comprising:
   a second editable cell in said row wherein said second editable cell in said row is restricted to a range set for a second variable corresponding to said parameter of said sub-system of said microcontroller.

27. The display object of claim 26 where said second editable cell displays said range set with a drop-down list.

* * * * *